United States Patent [19]

Tiemann

[11] 4,321,481

[45] Mar. 23, 1982

[54] RECURSIVE CHARGE TRANSFER FILTER WITH A TRANSMISSION ZERO AT ZERO FREQUENCY

[75] Inventor: Jerome J. Tiemann, Schenectady, N.Y.

[73] Assignee: General Electric Company, Schenectady, N.Y.

[21] Appl. No.: 153,712

[22] Filed: May 27, 1980

[51] Int. Cl.³ .................... G11C 19/28; H01L 29/78; H03H 15/02

[52] U.S. Cl. .............................. 307/221 D; 357/24; 333/165

[58] Field of Search .................... 357/24; 307/221 D; 333/165

[56] References Cited

U.S. PATENT DOCUMENTS 4,284,909 8/1981 Tiemann ........................ 307/221 D

*Primary Examiner*—Gene M. Munson

*Attorney, Agent, or Firm*—Julius J. Zaskalicky; James C. Davis, Jr.; Marvin Snyder

[57] ABSTRACT

A filter utilizing charge transfer devices for providing recursive transfer functions with a transmission zero at d.c. or zero frequency is described. The filter includes a circular charge transfer shift register having an even number N of stages, greater than two, and first, second, third and fourth linear charge transfer shift registers. All five shift registers are clocked at the same frequency. A first input sequence of packets of charge representing positive weight components of a signal, and a second sequence of packets of charge representing negative weight components of the signal are provided. Means are provided for dividing each of the packets of charge of the first input sequence into a first part and a second part and for applying each of the first parts of the packets of the first input sequence to the input stage of the first shift register and for applying each of the second parts of the packets of the first input sequence to the input stage of the second shift register. The charge packet in the first charge storage cell in the $K^{th}$ stage of the first shift register is combined with the charge packet in the first charge storage cell of the $N^{th}$ stage of the circular shift register. The combined packet of charge is divided into two portions, a first portion being stored in the first charge storage cell of the $K^{th}$ stage of the first shift register from which it is clocked out and sensed and a second portion being stored in the first charge storage cell of the $N^{th}$ stage of the circular shift register. The charge packet in the first charge storage cell of the $L^{th}$ stage of the second shift register is combined with the charge packet in the $M^{th}$ stage of the circular shift register, where M is an integer less than N/2 and $L=K+M$.

Means are provided for dividing each of the packets of charge of the second input sequence into a first part and a second part and for applying each of the first parts of the packets of the second input sequence to the input stage of the third shift register and for applying each of the second parts of the packets of the second input sequence to the input stage of the fourth shift register. The charge packet in the first charge storage cell in the $K^{th}$ stage of the third shift register is combined with the charge packet in the first charge storage cell of the $(N/2)^{th}$ stage of the circular shift register. The combined packet of charge is divided into two portions, a first portion being stored in the first charge storage cell of the $K^{th}$ stage of the third shift register from which it is clocked out and sensed and a second portion being stored in the first charge storage cell of the $(N/2)^{th}$ stage of the circular shift register. The charge packet in the first charge storage cell of the $L^{th}$ stage of the fourth shift register is combined with the charge packet in the $(N/2+M)^{th}$ stage of the circular shift register.

A first output sequence of packets of charge representing the positive components of an output signal is obtained at the output of the first shift register. A second output sequence of packets of charge representing the negative components of the output signal is obtained at the output of the second shift register. The output signal is obtained by differentially summing corresponding charge packets in the first and second output sequences.

4 Claims, 10 Drawing Figures

OUTPUT
1.0
A
A2
A3
A4
t0 t1 t2 t3 t4 t5 t6 t7 t8 t9 t10 t11 t12 t13 t14 t15 t16 t17 t18 t19
TIME

OUTPUT
1.0
V1
V2
AV2
A2V2
A3V2
t0 t1 t2 t3 t4 t5 t6 t7 t8 t9 t10 t11 t12 t13 t14 t15 t16 t17 t18 t19
TIME

1st INPUT STAGE
1st STAGE
2nd STAGE
3rd STAGE
φ'D φD φ'C φC
53 51 54 52 43 13 12 47 49 48
65 46 45 33a 45 65 46 45 37a 45 46 45 65 46 45 75 62

43 45 43 45 43 13 12
41 44a 42 44b 62

φ'D φD φ'C φC
53 51 54 52 37 35 49 48 47 49 48 47 43 13 12
35b 38 45 46 45 68a 45 46 62

1st STAGE
2nd STAGE
φ'D φD φ'C φC
53 51 54 52 43 35 47 49 48 49 48 43 13 12
33 35a 34 45 67 46 45 46 45 68a 62
66

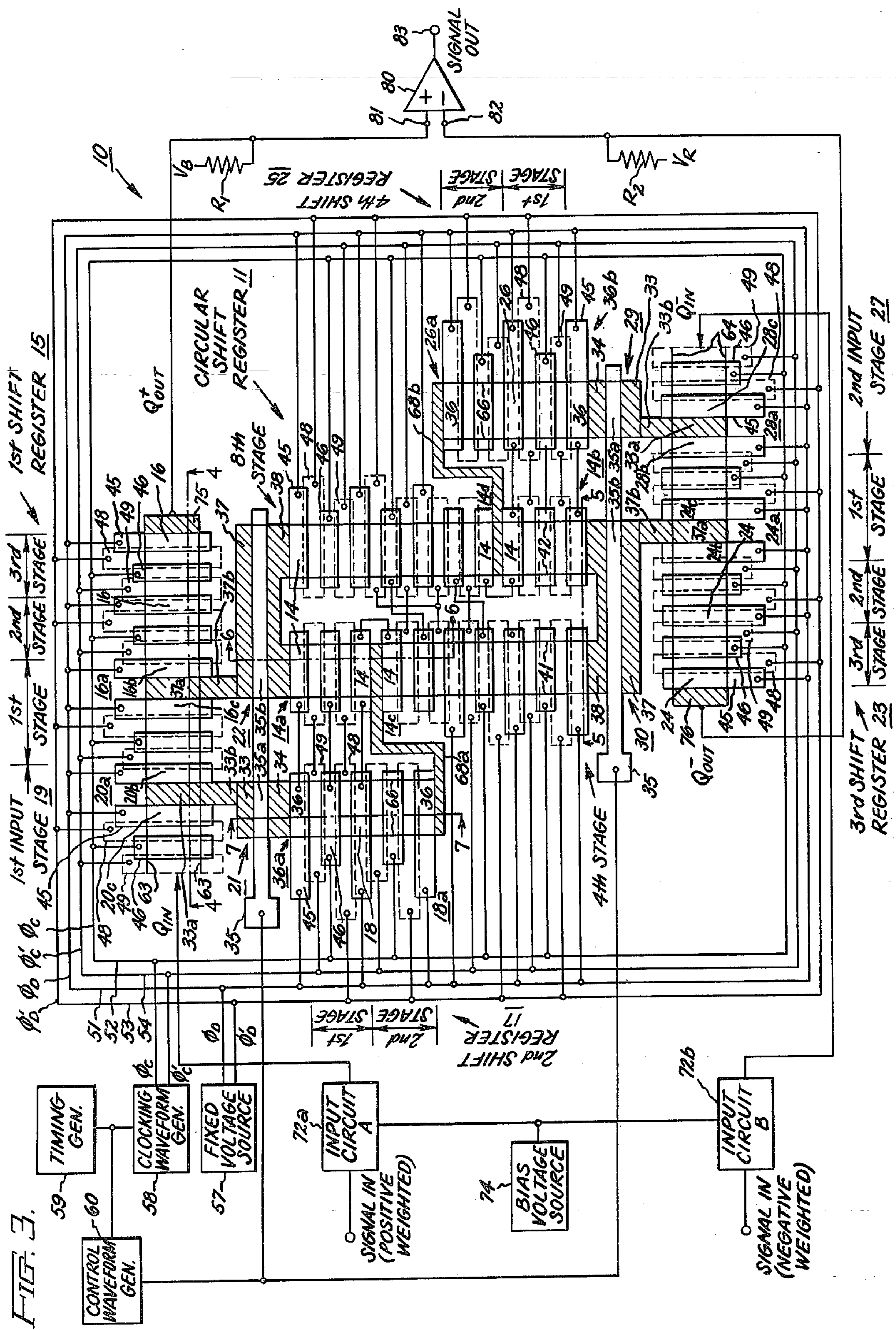
FIG. 3.
TIMING GEN.
CLOCKING WAVEFORM GEN.
FIXED VOLTAGE SOURCE
CONTROL WAVEFORM GEN.
INPUT CIRCUIT A
INPUT CIRCUIT B
BIAS VOLTAGE SOURCE
SIGNAL IN (POSITIVE WEIGHTED)
SIGNAL IN (NEGATIVE WEIGHTED)
SIGNAL OUT
CIRCULAR SHIFT REGISTER 11
1st SHIFT REGISTER 15
2nd SHIFT REGISTER 17
3rd SHIFT REGISTER 23
4th SHIFT REGISTER 25
1st INPUT STAGE 19
2nd INPUT STAGE 27
8th STAGE
4th STAGE
1st STAGE
2nd STAGE
3rd STAGE

RECURSIVE CHARGE TRANSFER FILTER WITH A TRANSMISSION ZERO AT ZERO FREQUENCY

The present invention relates in general to charge transfer signal processing apparatus for providing recursive transfer functions and more particularly to implementing a transmission zero in such apparatus.

This application is related to patent application Ser. No. 105,758, filed Dec. 20, 1979 now U.S. Pat. No. 4,259,597 and assigned to the assignee of the present invention, and incorporated herein by reference thereto.

An object of the present invention is to provide sampled data filter apparatus which provides impulse responses of infinite duration and which includes a transmission zero at d.c. or zero frequency without otherwise increasing the time duration of the impulse response of the apparatus.

Another object of the present invention is to provide sampled data filter apparatus which provides both a transmission zero at zero frequency and an arbitrary complex conjugate pole pair in a single device structure.

In carrying out the present invention in one illustrative embodiment thereof there is provided a circular shift register having N stages where N is an even number greater than two, each stage including a respective first charge storage cell. A first means is provided for transferring charge in the circular shift register from first charge storage cell to first charge storage cell thereof in the direction of order designation of the stages thereof. A first shift register is provided including a plurality of stages, each stage including a respective first charge storage cell. A second shift register is provided including L stages where L is an integer, each stage including a respective first charge storage cell. A first input sequence of packets of charge are provided, each packet representing a respective sample of a first input signal. Means are provided for dividing each of the packets of charge of said first input sequence into a first part and a second part, the ratio of said first part to the second part being equal to a first fixed value. Means are provided for applying each of the first parts of the packets of the first input sequence to the input stage of the first shift register and for applying each of the second parts of the packets of said first input sequence to the input stage of the second shift register. Second means are provided for sequentially transferring at the aforementioned one frequency each of the first parts of the first sequence of packets of charge from first charge storage cell to first charge storage cell of the stages of the first shift register. Third means are provided for sequentially transferring at the aforementioned one frequency each of the second parts of the first sequence of packets of charge from first charge storage cell to first charge storage cell of the stages of the second shift register. The first, second and third transferring means are synchronized to provide storage of charge packets in the first charge storage cells of the first and second shift registers and in the first charge storage cells of the circular shift register over a common interval of time, recurrent at the aforementioned one frequency. A first means is provided for combining the charge packet in the first charge storage cell in the $K^{th}$ stage of the first shift register with the charge packet in the first charge storage cell of the $N^{th}$ stage of the circular shift register during each of the common intervals of time and for dividing the combined packet of charge into two portions, a first portion being stored in the first charge storage cell of the $K^{th}$ stage and a second portion being stored in the first charge storage cell of the $N^{th}$ stage of the circular shift register, the ratio of said first portion of charge to the combined charge packet being equal to a second fixed value. Means are provided for transferring each first portion of a respective combined packet of charge out of the first charge storage cell of the $K^{th}$ stage at said one frequency to obtain a first output sequence of packets. A second means is provided for combining the charge packet in the first charge storage cell of the $L^{th}$ stage of the second shift register with the charge packet in the first charge storage cell of the $M^{th}$ stage of the circular shift register, where M is an integer less than N/2 and $L=K+M$.

A second input sequence of packets of charge is provided, each packet representing a respective sample of a second input signal. A third shift register is provided including a plurality of stages, each stage including a respective first charge storage cell. A fourth shift register is provided including L stages, each stage including a respective first charge storage cell. Means are provided for dividing each of the packets of charge of the second input sequence into a first part and a second part, the ratio of the first part to the second part being equal to the aforementioned first fixed value. Means are provided for applying each of the first parts of the packets of the second input sequence to the input stage of the third shift register and for applying each of the second parts of the packets of the second input sequence to the input stage of the fourth shift register. Fourth means are provided for sequentially transferring at the aforementioned one frequency each of the first parts of the second sequence of packets of charge from first charge storage cell to first charge storage cell of the stages of the third shift register. Fifth means are provided for sequentially transferring at the aforementioned one frequency each of the second parts of the sequence of packets of charge from first charge storage cell to first charge storage cell of the stages of the fourth shift register. The first, second, third, fourth and fifth transferring means are synchronized to provide storage of the charge packets in the first charge storage cells of the first, second, third and fourth shift registers and in the first charge storage cells of the circular shift register over a common interval of time, recurrent at the aforementioned one frequency. Third means are provided for combining the charge packet in the first charge storage cell in $K^{th}$ stage of the third shift register with the charge packet in the first charge storage cell of the $(N/2)^{th}$ stage of the circular shift register during each of the common intervals of time and for dividing the combined packet of charge into two portions, a first portion being stored in the first charge storage cell of the $K^{th}$ stage of the third shift register and a second portion being stored in the first charge storage cell of the $(N/2)^{th}$ stage of the circular shift register, the ratio of the first portion of charge to the combined charge packet being equal to the aforementioned second fixed value. Means are provided for transferring each first portion of a respective combined packet of charge out of the first charge storage cell of the $K^{th}$ stage of the third shift register at the aforementioned one frequency, to obtain a second output sequence of packets. Fourth means are provided for combining the charge packet in the first charge storage cell of the $L^{th}$ stage of the fourth shift register with the charge packet in the $(N/2+M)^{th}$ stage of the circular shift register.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein:

FIG. 3 is a plan view of a sampled data apparatus in accordance with the present invention;

In the above-referenced patent application Ser. No. 105,758 a filter utilizing charge transfer devices for providing recursive transfer functions is disclosed. The filter includes a circular charge transfer shift register having an even number N of stages, greater than two, and first and second linear charge transfer shift registers. A composite stage of the first linear shift register is coupled to the $N^{th}$ stage of the circular shift register through a first gating means. A composite stage of the second shift register is coupled to the $(N/2)^{th}$ stage of the circular shift register through a second gating means. A first input sequence of packets of charge representing positive weight components of a signal is applied to the first shift register, and a second sequence of packets of charge representing negative weight components of the signal is applied to the second shift register. All three shift registers are clocked at the same frequency. At the end of each clocking cycle the first gating means is operative to combine the charge stored in the $N^{th}$ stage of the circular shift register and the charge stored in the composite stage of the first linear shift register and to divide the combined charge into a first part contained in the composite stage of the first linear shift register from which it is clocked out and sensed, and a second part which is retained in the circular shift register. Similarly, the second gating means is operative at the end of each clocking cycle to combine the charge stored in the $(N/2)^{th}$ stage of the circular shift register and the charge stored in the composite stage of the second linear shift register and to divide the combined charge into a first part contained in the composite stage of the second linear shift register from which it is clocked out and sensed, and a second part which is retained the circular shift register. A first output sequence of packets of charge representing the positive components of an output signal is obtained at the output of the first shift register. A second output sequence of packets of charge representing the negative components of the output signal is obtained at the output of the second shift register. The output signal is obtained by differentially summing corresponding charge packets in the first and second output sequences. Differential summation is performed by a differential amplifier with the first output sequence being applied to the non-inverting input terminal thereof and the second output sequence being applied to the inverting terminal thereof.

Figure 1:
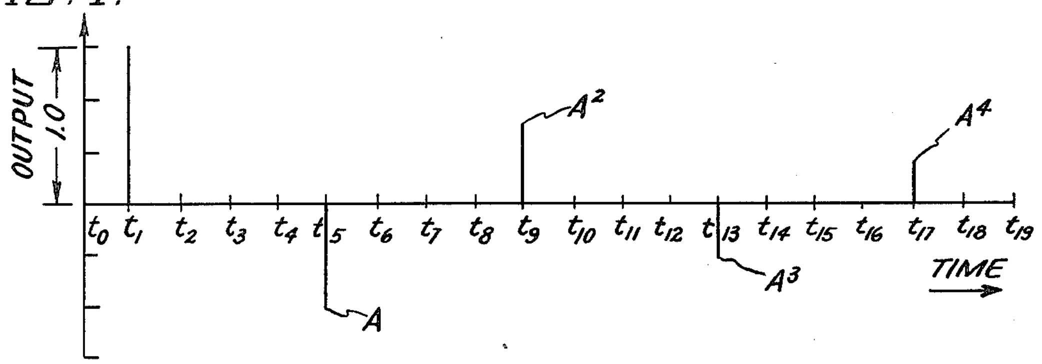
FIG. 1 is a diagram showing the impulse response of prior art apparatus.

The impulse response of a filter such as described above using a circular shift register having eight stages is shown in FIG. 1. The initial pulse of the output sequence is positive and has an amplitude of unity and successive pulses alternate in polarity and decay exponentially by the fraction A. The sum $S^+$ of the positive components of the output sequence may be represented by the expression:

$$S^+=1+A^2+A^4+\ldots \quad (1)$$

or $$S^+=1/(1-A^2), \quad (2)$$

wherein A is less than 1.

Equation 2 is readily derived from equation 1 by multiplying equation 1 by $A^2$ and subtracting the resultant equation from equation 1. Thus, the numerator of equation 2 represents the first term and $A^2$ represents the ratio of successive positive components. Similarly, the sum of the negative components of the sequence may be represented by the expression:

$$S^-=A+A^3+A^5+\ldots \quad (3)$$

or $$S^-=A(1+A^2+A^4+\ldots)$$

or $$S^-=A/(1-A^2) \quad (4)$$

where A is the first term of the sequence, and $A^2$ is the ratio of successive positive components. The sum S of the sum $S^+$ components and the sum $S^-$ of the negative components of the sequence may be represented by the expression:

$$S=1/(1-A^2)\text{-}A/(1-A^2)=1/(1+A) \quad (5)$$

Thus, the sum of the positive components and the negative components equal a value other than zero. Accordingly, the d.c. or zero frequency response of the recursive resonator is other than zero.

In some applications of filters in which such recursive resonators would be utilized it is desirable and advantageous to have a zero response at zero frequency. In accordance with the present invention such a characteristic, in one implementation, is provided by diverting a predetermined fraction of each of the signal charge packets from the stage where equilibration with the resonator occurs. Each diverted fraction of charge is then added to the remainder of the respective packet in the resonator. Thus, this diverted charge appears at all impulse response output times, ($5^{th}$, $9^{th}$ etc.) except the first, and the first output is reduced in amplitude compared to what it would have been if no diversion took place. The amount of charge diverted is chosen such that the algebraic sum of the elements of the output sequence for each input signal pocket is equal to zero.

Figure 2:
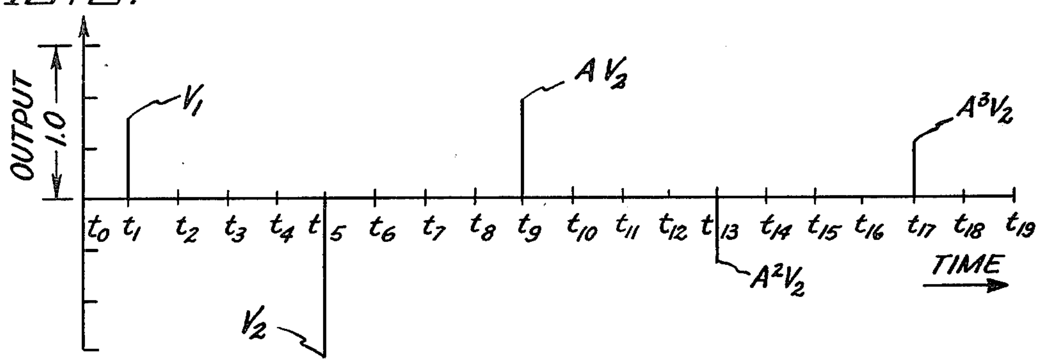
FIG. 2 is a diagram showing the impulse response of apparatus of the present invention.
Figure 4:
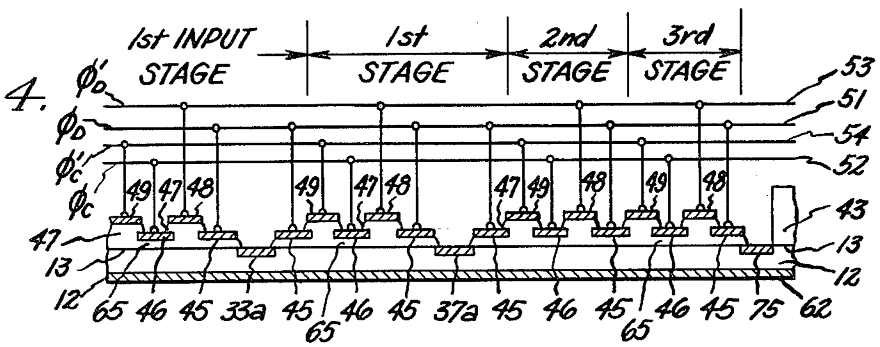
FIG. 4 is a sectional view of the apparatus of FIG. 3 taken along section lines 4—4 thereof.
Figure 5:
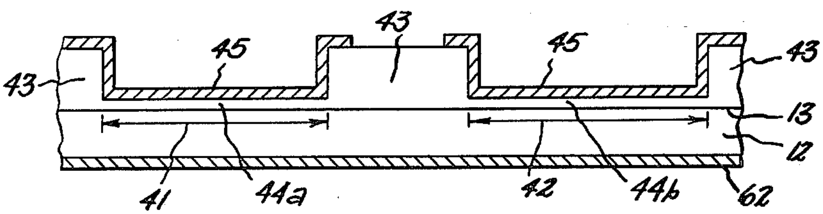
FIG. 5 is a sectional view of the apparatus of FIG. 3 taken along section lines 5—5 thereof.
Figure 6:
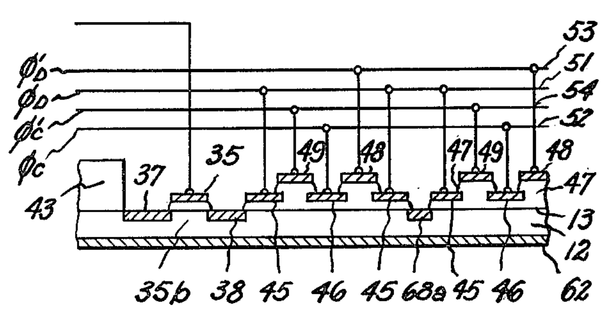
FIG. 6 is a sectional view of the apparatus of FIG. 3 taken along section lines 6—6 thereof.
Figure 7:
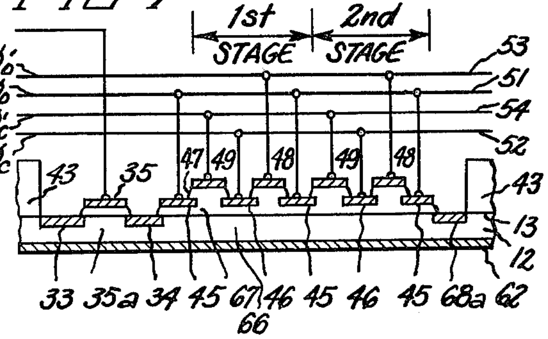
FIG. 7 is a sectional view of the apparatus of FIG. 3 taken along section lines 7—7 thereof.

The relationship of the first element $V_1$ and the second element $V_2$ of the output sequence to provide zero output at zero frequency will now be determined. Reference is made to FIG. 2. From equation 4 the sum $S^-$ of the negative components is as follows:

$$S^- = V_2/(1-A^2)$$

The sum $S^+$ of the positive component is as follows:

$$S^+ = V_1 + AS^-,$$

or $$S^+ = V_1 + AV_2/(1-A^2)$$

For $S^- = S^+$ $$V_2/(1-A^2) = V_1 + AV_2/(1-A^2)$$

or $$V_2 = (1+A)V_1 \quad (6)$$

Thus, if the first element $V_1$ and second element $V_2$ of the sequence are proportioned as set forth above in equation 6, the sum of the positive components and the negative components of each impulse response would equal zero, as desired. Transformed into the frequency domain, zero output would be obtained at zero frequency.

Reference is now made to FIGS. 3-7 which show apparatus 10 in accordance with the present invention. The apparatus includes a closed ended or circular charge transfer shift register 11, conveniently shown as having eight stages, formed on a common substrate 12 of semiconductor material having a major surface 13. Each stage of the shift register 11 includes a respective first charge storage cell 14 adjacent the major surface 13. The first charge storage cells of the $N^{th}$ stage ($8^{th}$ stage) and the $(N/2)^{th}$ stage ($4^{th}$ stage) are composite storage cells and are specifically designated as cells 14*a* and 14*b*, respectively. The first charge storage cells of the $1^{st}$ and $5^{th}$ stages are also composite storage cells and are specifically designated as cells 14*c* and 14*d*, respectively. The packets of charge stored in each of the first charge storage cells 14 of the circular shift register are shifted or transferred to a respective adjacent first charge storage cell 14 in the direction of order designation of the stages at a preset frequency, referred to as the clocking frequency $f_c$.

The apparatus 10 also includes a first linear shift register 15 of several stages, conveniently shown as three stages, formed on the substrate 12, each stage including a respective first charge storage cell 16 adjacent the major surface 13. The first charge storage cell of the first stage of the first linear shift register is a composite storage cell and is specifically designated as cell 16*a*. The apparatus 10 also includes a second linear shift register 17 of several stages, specifically two for this embodiment for reasons which will be explained below, formed on the substrate 12, each stage including a respective first charge storage cell 18 adjacent the major surface 13. The first charge storage cell of the last stage of the second linear shift register is a composite storage cell and is specifically designated as cell 18*a*. The apparatus also includes a first input stage 19 including a composite first charge storage cell 20*a*, the output of which is coupled to the input of the first stage of the first shift register 15. The first charge storage cell 20*a* is also coupled to the input of the first stage of the second shift register 17 through a first gating stage 21. The first stage of the first shift register 15 is coupled to the $N^{th}$ stage of circular shift register 11 through a second gating stage 22. The output of the second stage of the second shift register 17 is coupled to the first stage of the circular shift register 11. Each of a first sequence $Q^+_n$ of packets of charge is introduced serially into the first charge storage cell of the first input stage 21 and thereafter divided into a first part denoted by fraction $\lambda$ and a second part denoted by fraction $(1-\lambda)$. Each first part is passed on to the first charge storage cell 16*a* of the first stage of the first linear shift register 15 wherein each is altered in a manner which will be described below and thereafter is transferred out at the aforementioned frequency $f_c$. Each second part is transferred to input of the second shift register 17 and then transferred to the first stage of the circular shift register in a manner which will also be described below.

The apparatus 10 additionally includes a third linear shift register 23 of several stages, conveniently shown as three stages, formed on the substrate 12, each stage including a respective first charge storage cell 24 adjacent the major surface 13. The first charge storage cell of the first stage of the first linear shift register is a composite storage cell and is specifically designated as cell 24*a*. The apparatus 10 also includes a fourth linear shift register 25 of several stages, specifically two for this embodiment for reasons to be explained below, formed on the substrate 12, each stage including a respective first charge storage cell 26 adjacent the major surface 13. The first charge storage cell of the last stage of the second linear shift register is a composite storage cell and is specifically designated as cell 26*a*. The apparatus also includes a second input stage 27 including a composite first charge storage cell 28*a*, the output of which is coupled to the input of the first stage of the third shift register 23. The first charge storage cell 28*a* is also coupled to the input of the first stage of the fourth shift register through a third gating stage 29. The first stage of the third shift register is coupled to the $(N/2)^{th}$ stage of the circular shift register 111 through a fourth gating stage 30. The output of the second stage of the fourth shift register 25 is coupled to the fifth stage of the circular shift register 11. Each of a second sequence $Q^-_n$ of packets of charge is introduced serially into the first charge storage cell of the second input stage and thereafter divided into a first part denoted by a fraction $\lambda$ and a second part denoted by a fraction $(1-\lambda)$. Each first part is passed on to the first charge storage cell 24*a* of the first stage of the third linear shift register 23 wherein each is altered in a manner which will be described below and thereafter is transferred out at the aforementioned frequency $f_c$. Each second part is transferred to input of the fourth shift register and then transferred to fifth stage of the circular shift register in a manner which will also be described below. At the output of the first linear shift register 15 a first output sequence $Q^+_{out}$ of charge packets is obtained and at the output of the third linear shift register 23 a second output sequence $Q^-_{out}$ of charge packets is obtained. Output from the apparatus is obtained by differentially summing corresponding charge packets in the first and second output sequences by means of differential amplifier 80.

The first gating stage 21 comprises a pair of regions 33 and 34 of opposite conductivity type in the substrate 12 adjacent the major surface 13 thereof and of generally elongated outline. Adjacent linear edges of the regions 33 and 34 are parallel and form a short channel region 35*a* therebetween adjacent the major surface 13. A gating electrode 35 is provided insulatingly overlying and in registry with the channel region 35*a*. When an inversion producing voltage is applied to the gating electrode 35, a conduction channel is established in the channel region 35*a* between the opposite conductivity type regions 33 and 34. A first charge storage cell 36 is contiguous with the region 34 of opposite conductivity type of first gating stage to facilitate the transfer of charge to the first stage of the second shift register 17 and with region 34 constitutes composite storage cell 36*a*. Third gating stage 29 is identical in structure to first gating stage 21 and corresponding elements thereof are identically designated. The first charge storage cell 36 contiguous with region 34 of the third gating stage constitutes composite storage cell 36*b* identical to composite storage cell 36*a*.

The second gating stage 22 comprises a pair of regions 37 and 38 of opposite conductivity type in the substrate 12 adjacent the major surface 13 thereof and of generally elongated outline. Adjacent linear edges of the regions 37 and 38 are parallel and form a short channel region 35*b* therebetween adjacent the major surface 13. Gating electrode 35 is provided insulatingly overlying and in registry with the channel region 35*b*. When an inversion producing voltage is applied to the gating electrode 35, a conduction channel is established in the channel region 35*b* between the opposite conductivity type regions 37 and 38. Fourth gating stage 30 is identical in structure to second gating shape 22 and corresponding elements thereof are identically designated.

The composite first charge storage cell 20*a* of the first input stage comprises a first storage cell 20*b* having the same width as channel region 63 of the substrate 12 included in the first linear shift register 15, a first region 33*a* of opposite conductivity type and of the same width as first storage cell 20*b* and contiguous along its width therewith, and another first storage cell 20*c* also of the same width as region 33*a* of opposite conductivity type and contiguous therewith. The opposite conductivity type region 33*a* is conductively connected to the opposite conductivity type region 33 by opposite conductivity type region 33*b*.

The composite first charge storage cell 16*a* of the first stage of the first shift register 15 comprises a first storage cell 16*b* having the same width as channel region 63 of the substrate 12 included in the first linear shift register 15, a first region 37*a* of opposite conductivity type and of the same width as first storage cell 16*b* and contiguous along its width therewith, and another first storage cell 16*c* also of the same width as region 37*a* of opposite conductivity type and contiguous therewith. The opposite conductivity type region 37*a* is conductively connected to the opposite conductivity type region 37 by opposite conductivity type region 37*b*.

The composite first storage cell 14*a* of the $N^{th}$ or eighth stage of the circulating shift register 11 comprises a pair of first storage cells 14 and the region 38 of opposite conductivity type. One side of each of the pair of first storage cells 14 is contiguous with the side of the elongated region 38 of opposite conductivity type which is opposite the side thereof adjacent the channel region 25*b* of the gating means 22.

The composite first charge storage cell 28*a* of the second input stage comprises a first storage cell 28*b* having the same width as channel region 64 of the substrate 12 included in the third linear shift register 23, a first region 33*a* of opposite conductivity type and of the same width as first storage cell 28*b* and contiguous along its width therewith, and another first storage cell 28*c* also of the same width as region 33*a* of opposite conductivity type and contiguous therewith. The opposite conductivity type region 33*a* is conductively connected to the opposite conductivity type region 33 by opposite conductivity type region 33*b*.

The composite first charge storage cell 24*a* of the first stage of the third linear shift register 23 comprises first storage cell 24*b* having the same width as the channel region 64 of the substrate 12 included in the third linear shift register 23, a first region 37*a* of opposite conductivity type and of the same width as the first storage cell 24*b* and contiguous therewith along its width, and another first charge storage cell 24*c*, also of the same width as region 37*a* of opposite conductivity type and contiguous therewith. The opposite conductivity type region 37*a* is conductively connected to the opposite conductivity type region 37 by opposite conductivity type region 37*b*.

The composite first storage cell 14*b* of the $(N/2)^{th}$ or fourth stage of the circulating shift register 11 comprises a pair of first charge storage cells 14 and a region 38 of opposite conductivity type. One side of each of the pair of first storage cells is contiguous with the side of the elongated region 24 of opposite conductivity type which is opposite the side thereof adjacent the channel region 25*b* of the gating means 22.

The structure of the shift registers 11, 15, 17, 23 and 25, and the manner of transferring and storing charge in these shift registers will now be described. The circular shift register 11 is formed on semiconductor substrate 12 of N-type conductivity which has a pair of channel portions 41 and 42. Typically, the substrate may be silicon semiconductor material of suitable resistivity, for example, 4 ohm-cm. Overlying the major surface 13 of the substrate 12 is a thick insulating member 43 of the silicon dioxide having thin insulating portions 44*a* and 44*b* therein lying in registry with the respective channel portions 41 and 42. A plurality of first electrodes 45 are provided on the insulating member 43 overlying thin insulating portions 44*a* and 44*b*. Each of the first electrodes 45 is of uniform length in the direction of the length dimension of the channel portions 41 and 42, that is, in the direction of charge transfer. Each of the first electrodes 45 extends across both the thin insulating portion and the bordering thick insulating portions of the insulating member 43. A plurality of second electrodes 46 is provided on the insulating member 43 overlying the thin portions 44*a* and 44*b*. Each of the second electrodes 46 is of uniform length in the direction of the length dimension of the channel portions 41 and 42 equal to the uniform length of the first electrode 45. Each of the electrodes 46 extend across both the thin insulating portions 44*a* and 44*b* and the bordering thick insulating portions of the insulating member 43. An insulating layer 47 is provided over the electrodes 45 and 46. A plurality of first transfer electrodes 48 is provided over the insulating layer 47. Each of the first transfer electrodes 48 is insulatingly spaced between a respective second electrode 46 and an adjacent succeeding first electrode 45 and overlying these electrodes. A plurality of second transfer electrodes 49 is provided over the insulating layer 47. Each of the second transfer electrodes 49 is insulatingly spaced between a respective first electrode 45 and an adjacent succeeding second electrode 46 and overlying these electrodes. Each of the transfer electrodes 48 and 49 is of substantially uniform extent in the direction of the length of the channel portions 41 and 42 and extends over the thin insulating portions 44*a* and 44*b* of the insulating member 43 as well as the bordering thick insulating portions thereof.

Figure 8:
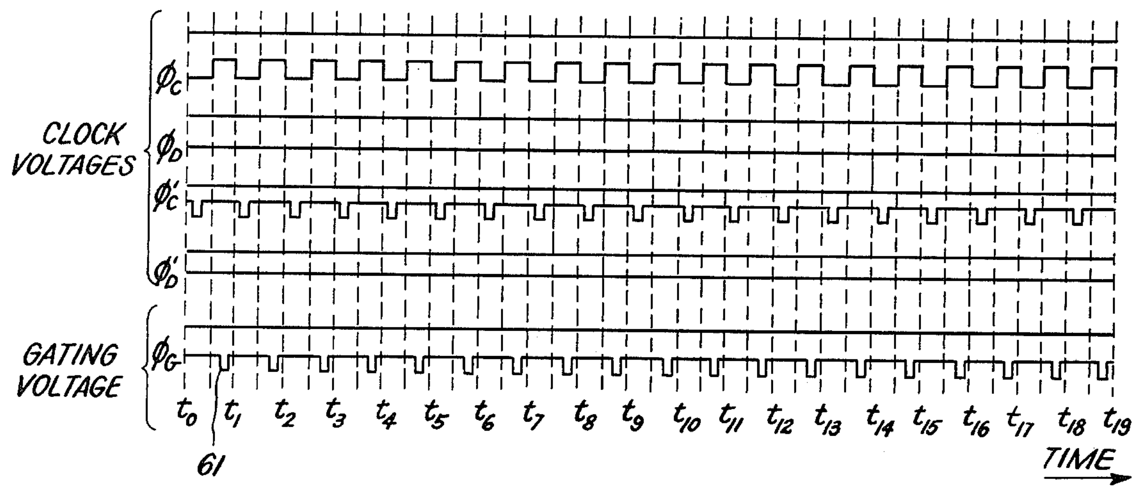
FIG. 8 is a diagram of voltage waveforms useful in describing the operation of the apparatus of FIG. 3.

All of the first electrodes 45 of the shift register 11 are connected to a line 51 to which $\phi_D$ voltage is supplied from a voltage source 57. All of the second electrodes 46 of the shift register 11 are connected to line 52 to which a $\phi_C$ voltage is supplied from a clocking waveform generator 58. The clocking waveform generator 58 is under the control of the timing generator 59. All of the first transfer electrodes 48 of the shift register 11 are connected to a $\phi_D'$ line 53 to which a $\phi_D'$ voltage is supplied from the fixed voltage source 57. All of the second transfer electrodes 49 of the shift register 11 are connected to a $\phi_C'$ line 54 to which a $\phi_C'$ voltage is applied from clocking waveform generator 58. A conductive layer 62 of a suitable material such as gold is eutectically bonded to the lower surface of the substrate 12 to provide a substrate contact to which the ground lines of the $\phi_D$, $\phi_D'$, $\phi_C$ and $\phi_C'$ sources are connected. The $\phi_C$, $\phi_D$, $\phi_C'$ and $\phi_D'$ voltage waveforms are shown in FIG. 8.

The first linear shift register 15 is also formed on the semiconductor substrate 12 overlying channel portion 63 thereof. A thin insulating portion 65 is provided in thick insulating member 43 lying in registry with the channel portion 63. A plurality of first electrodes 45 are provided on the insulating member 43 overlying the thin insulating portion 65. Each of the first electrodes 45 is of uniform length in the direction of the length dimension of the channel portion 63, that is, in the direction of charge transfer. Each of the first electrodes 45 extends across both the thin insulating portion 65 and the bordering thick insulating portions of the insulating member 43. A plurality of second electrodes 46 is provided on the insulating member 43 overlying the thin insulating portion 65 thereof. Each of the electrodes 46 is of uniform length in the direction of the length dimension of the channel portion 63 and equal to the uniform length of a first electrode 45. Each of the electrodes 46 extend across both the thin insulating portion 65 and the bordering thick insulating portions of the insulating member 43. An insulating layer 47 is provided over the electrodes 45 and 46. A plurality of first transfer electrodes 48 is provided over the insulating layer 47. Each of the first transfer electrodes 48 is insulatingly spaced between a respective second electrode 46 and an adjacent succeeding first electrode 45 and overlying these electrodes. A plurality of second transfer electrodes 49 is provided over the insulating layer 47. Each of the second transfer electrodes 49 is insulatingly spaced between a respective first electrode 45 and an adjacent succeeding second electrode 46 and overlying these electrodes. Each of the transfer electrodes 48 and 49 is of substantially uniform extent in the direction of the length of the channel portion 63 and extends over the thin insulating portions 64 of the insulating member 43 as well as the bordering thick insulating portions thereof.

All of the first electrodes 45 of the shift register 15 are connected to line 51 to which $\phi_D$ voltage is supplied. All of the second electrodes 46 of the shift register 15 are connected to line 52 to which $\phi_C$ voltage is supplied. All of the first transfer electrodes 48 of the shift register 15 are connected to $\phi_D'$ line 53 to which $\phi_D'$ voltage is supplied. All of the second transfer electrodes 49 of the shift register 15 are connected to $\phi_C'$ line 54 to which a $\phi_C'$ voltage is supplied.

The third linear shift register 23 is also formed on the semiconductor substrate 12 overlying channel portions thereof and is identical in structure to the first linear shift register 15 and corresponding elements thereof are identically designated.

The second shift register 17 is also formed on the semiconductor substrate 12 overlying channel portion 66 thereof. A thin insulating portion 67 is provided in thick insulating member 43 lying in registry with the channel portion 66. A plurality of first electrodes 45 are provided on the insulating member 43 overlying the thin insulating portion 67. Each of the first electrodes 45 is of uniform length in the direction of the length dimension of the channel portion 66, that is, in the direction of charge transfer. Each of the first electrodes 45 extends across both the thin insulating portion 67 and the bordering thick insulating portions of the insulating member 43. A plurality of second electrodes 46 is provided on the insulating member 43 overlying the thin insulating portion 66 thereof. Each of the electrodes provided on the insulating member 43 overlying the thin insulating portion 66 thereof. Each of the electrodes 46 is of uniform length in the direction of the length dimension of the channel portion 66 and equal to the uniform length of a first electrode 45.

Each of the electrodes 46 extend across both the thin insulating portion 67 and the bordering thick insulating portions of the insulating member 43. An insulating layer 47 is provided over the electrodes 45 and 46. A plurality of first transfer electrodes 48 is provided over the insulating layer 47. Each of the first transfer electrodes 48 is insulatingly spaced between a respective second electrode 46 and an adjacent succeeding first electrode 45 and overlying these electrodes. A plurality of second transfer electrodes 49 is provided over the insulating layer 47. Each of the second transfer electrodes 49 is insulatingly spaced between a respective first electrode 45 and an adjacent succeeding second electrode 46 and overlying these electrodes. Each of the transfer electrodes 48 and 49 is of substantially uniform extent in the direction of the length of the channel portion 66 and extends over the thin insulating portions 67 of the insulating member 43 as well as the bordering thick insulating portions thereof. An elongated region 68*a* of opposite conductivity type is provided in the substrate 12 connecting the first charge storage 36 of the second stage of the second shift register 17 to a pair of first charge storage cells 14 of the first stage of the circular shift register 11. The elongated region 68*a* enables charge transferred to the second stage of the second shift register to be combined with the charge transferred to the first stage of the circular shift register 11.

All of the first electrodes 45 of the shift register 17 are connected to line 51 to which a $\phi_D$ voltage is supplied. All of the second electrodes 46 of the shift register 17 are connected to line 52 to which a $\phi_C$ voltage is supplied. All of the first transfer electrodes 48 of the shift register 17 are connected to the line 53 to which a $\phi_D'$ voltage is supplied. All of the second transfer electrodes 49 of the shift register 17 are connected to line 54 to which a $\phi_C'$ voltage is supplied.

The fourth linear shift register 25 is also formed on the semiconductor substrate 12 overlying channel portions thereof and is identical in structure to the second shift register 17 and corresponding elements thereof are identically designated. An elongated region 68*b* of opposite conductivity type is also provided in the substrate 12 connecting the first charge storage cell 36 of the second stage of the second shift register 17 to a pair of first charge storage cells 14 of the fifth stage of the circular shift register 11. The elongated region 68*b* enables charge transferred to the second stage of the fourth shift register 25 to be combined with the charge transferred to the fifth stage of the circular shift register 11.

Each stage of the shift registers 11, 15, 17, 23 and 25 includes a $\phi_D$ storage cell (first storage cell) underlying a $\phi_D$ line 45 and a $\phi_C$ storage cell (second storage cell) underlying a $\phi_C$ line 46. The $\phi_D$ voltage (FIG. 8) applied to the $\phi_D$ line 45 is fixed. The $\phi_C$ voltage applied to the $\phi_C$ line 46 cycles between a high level and a low level above and below the $\phi_D$ voltage. When the $\phi_C$ voltage is at its high level, charge transfer is enabled from a $\phi_C$ cell to a $\phi_D$ cell, and conversely when the $\phi_C$ voltage is at its low level, charge transfer is enabled from a $\phi_D$ cell to a $\phi_C$ storage cell. Each stage also includes a $\phi_D'$ line 48 to which is applied a $\phi_D$ voltage of fixed value which produces a surface potential in the substrate underlying the electrode which is smaller in absolute magnitude than the surface potential underlying a $\phi_D$ line. Each stage also includes a $\phi_C'$ electrode 49 to which is applied a $\phi_C'$ voltage having two levels. At the upper level a surface potential is produced in the substrate underlying the electrode which inhibits the transfer of charge from a $\phi_D$ storage cell to a $\phi_C$ storage cell. At the lower level a surface potential is produced enabling the transfer of charge from a $\phi_D$ storage cell to a $\phi_C$ storage cell. Thus, when the $\phi_C$ voltage it at its high level, charge is transferred from a $\phi_C$ storage cell to a $\phi_D$ storage cell, and when both the $\phi_C$ voltage and the $\phi_C'$ voltage are at their low levels charge is transferred from a $\phi_D$ storage cell to a $\phi_C$ storage cell. For each cycle of the clocking voltages $\phi_C$ and $\phi_C'$, charge is transferred from a $\phi_C$ storage cell to a $\phi_D$ storage cell and then to a next succeeding $\phi_C$ storage cell.

Input circuits 72*a* and 72*b* are provided, each for generating a respective sequence of packets of charge corresponding to a respective sequence of signal samples. A first sequence of signal samples corresponding to the positive components of an input signal sequence is applied to input circuit 72*a* and a second sequence of samples corresponding to the negative components of the input signal sequence is applied to the input circuit 72*b*. Input circuits 72*a* and 72*b*, such as referred to above, are well-known in the art, one of which is described in connection with FIGS. 8A, 8B and 8C in the U.S. Pat. No. 4,032,867, assigned to the assignee of the present invention and incorporated herein by reference thereto. This particular circuit is referred to as a "fill and spill" circuit. Of course, other input circuits may be utilized. A bias voltage source 74 connected to the input circuits 72*a* and 72*b* provides a fixed bias charge component to each packet of charge developed by the input circuits 72*a* and 72*b* which facilitates the transfer thereof.

The output of the input circuit 72*a* is applied to the first input stage 19. The output of the input circuit 72*b* is applied to the second input stage 27. Adjacent the first storage cell 16 of the third stage of shift register 15 a charge collection means in the form of a region 75 of opposite conductivity type is provided for the collection of charge flowing into the first charge storage cell of this stage. Adjacent the first storage cell 24 of the third stage of the shift register 23 a charge collection means in the form of a region 76 of opposite conductivity type is provided for the collection of charge flowing into the first charge storage cell of this stage.

An output circuit is provided for sensing the charge collected on the region 75 of opposite conductivity type of the first shift register 15 and for sensing the charge collected on the region 76 of opposite conductivity type of the third shift register 23 and for producing an output which represents the difference of the sensed charges. To this end a bias voltage $V_B$ is applied to the region 75 of the first shift register through a first resistance $R_1$ and also to region 76 of the second shift register through a second resistance $R_2$ which is equal to the first resistance $R_1$. The potential of $V_B$ is set to provide a potential at the regions 75 and 76 which is less than the surface potential of the empty first storage cells of the first and third shift registers. The signal appearing at 75 of the first shift register is applied to the non-inverting terminal 81 of a differential amplifier 80. The signal appearing at region 76 of the third shift register is applied to the inverting terminal 82 of the differential amplifier 80. Thus, at the output terminal 83 of the differential amplifier a signal is obtained which is the difference of the signals appearing at regions 75 and 76.

Figure 9:
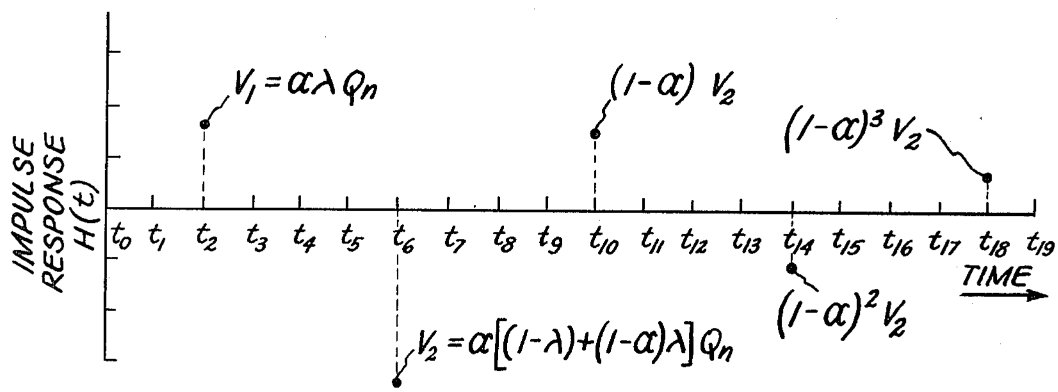
FIG. 9 is a diagram showing the impulse response of the apparatus of FIG. 3.

The operation of the apparatus of FIGS. 3–7 will now be explained in connection with the waveform diagrams of FIG. 8 and impulse response diagram of FIG. 9. Over a first clock period $t_0$–$t_1$, a unit packet $Q_n$ of charge is transferred into the composite storage cell 20*a* of the first input stage. At the end of this clock period a pulse 61 of gating voltage $\phi_G$ from control gate waveform generator 60 is applied to gating electrode 35 of the first gating stage 21 to cause the charge to flow into the composite storage cell 36*a* of the first gating stage. The pulse 61 is sufficiently long to allow the charge to equilibrate in the two cells. Upon termination of the pulse 61, a first part of the charge designated $\lambda Q_n$ is contained in storage cell 20*a* of the first input stage. A second part of the charge designated $(1-\lambda)Q_n$ is contained in the storage cell 36*a* of the first gating stage 21. Over a second clock period $t_1$–$t_2$, the packet of charge $\lambda Q_n$ is transferred into the composite storage cell 16*a* of the first stage of the first shift register 15. At the end of this clock period another pulse of gating voltage $\phi_G$ from control gate waveform generator 50 is applied to gating electrode of the second gating stage 22 to cause the charge to flow into the composite storage cell 14*a* of the circular shift register 11. The pulse 61 is sufficiently long to allow the charge to equilibrate in the two cells. Upon termination of the pulse, a first portion $\alpha\lambda Q_n$ is contained in storage cell 16*a* and is clocked out of the second shift register to non-inverting terminal 55 of the differential amplifier 56 from which a positive output $V_1$ is corresponding thereto is obtained as shown in FIG. 9. $V_1$ is shown as equal to $\alpha\lambda Q_n$ at time $t_2$. A second part designated $(1-\alpha)\lambda Q_n$ is contained in storage cell 14*a*. Also, over the second clock period $t_1$–$t_2$, the packet of charge $(1-\lambda)Q_n$ in storage cell of first gating stage 21 is transferred into the first storage cell of the first stage of the second shift register 17. Over a third clock period $t_2$–$t_3$, the packet of charge $(1-\alpha)\lambda Q_n$ is transferred into the first storage cell of the first stage of the circular shift register 11. Also, over the third clock period, the packet of charge $(1-\lambda)Q_n$ is transferred to the second stage of the circular shift register. As first charge storage cell 18a and first charge storage cell 14c are connected in common by region of opposite conductivity type, these packets of charge combine. The combined packet is represented by $[(1-\lambda)+(1-\alpha)\lambda]Q_n$. Over the fourth ($t_3$–$t_4$) and fifth ($t_4$–$t_5$) clock periods the resultant packet is transferred successively to the second and third stages of the circular shift register.

Over the sixth clock period, $t_5$–$t_6$, the resultant packet is transferred to the fourth stage of the circular shift register. At the end of this interval the pulse 61 of gating voltage $\phi_G$ which is applied to the gating electrode 35 of the fourth gating stage causes the charge to flow into the composite storage cell 24a of the first stage of third shift register 23. After equilibration of charge in the storage cells 24b and 14b and upon termination of the pulse 61, a first part of the charge $\alpha[(1-\lambda)+(1-\alpha)\lambda]Q_n$ is contained in storage cell 24a and a second part $(1-\alpha)[(1-\lambda)+(1-\alpha)\lambda]Q_n$ is contained in storage cell 14b. The first part $\alpha[(1-\lambda)+(1-\alpha)\lambda]Q_n$ is clocked out of the third shift register 23 to inverting terminal 82 of the differential amplifier 80 from which a negative output $V_2$ is obtained, this is shown in FIG. 9 as output $V_2=\alpha[(1-\lambda)+(1-\alpha)\lambda]Q_n$ at time $t_6$. Over the next four clock periods $t_6$–$t_7$, $t_7$–$t_8$, $t_8$–$t_9$, and $t_9$–$t_{10}$ the second part $(1-\alpha)[(1-\lambda)+(1-\alpha)\lambda]Q_n$ is transferred to the eighth stage of the circular shift register. At the end of the period $t_9$–$t_{10}$ the pulse 61 of gating voltage $\phi_G$ applied to electrode 35 of the second gating stage 22 causes the charge packet to flow into the composite storage cell 16a of the first stage of first shift register 15. After equilibration of charge in the storage cells 16a and 14a and upon termination of the pulse, a first part of the charge $\alpha(1-\alpha)[(1-\lambda)+(1-\alpha)\lambda]Q_n$, or $(1-\alpha)V_2$, is contained in storage cell 16a and a second part $(1-\alpha)V_2$ is contained in storage cell 14a. The first part $(1-\alpha)V_2$ is clocked out of the first shift register and applied to the non-inverting terminal 81 of differential amplifier 80 from which positive output of $(1-\alpha)V_2$ is obtained at time $t_{10}$, as shown in FIG. 9. Similarly at time $t_{14}$, a negative output of $(1-\alpha)^2V_2$ is obtained and at time $t_{18}$ a positive output of $(1-\alpha)^3V_2$ is obtained.

If additional impulses of charge were applied to the first input stage 19, each of the outputs would be the same as shown in FIG. 9 except shifted in time. Also, if an impulse of charge were applied to the second input stage 27, while applying no signal to the first input stage 19, the output obtained would be the same as shown in FIG. 9 except inverted in polarity. Thus, as any input signal applied to the first input stage can be decomposed into a sequence of impulses, and also as any input applied to the second input stage can be decomposed into a sequence of impulses, it is apparent that the response of the filter of FIGS. 3–7 to such inputs would be the super position of the responses of the filter to the individual impulses into which the input signals are decomposed. Thus, by convolving the positive weighted components and the negative weighted components of an input signal with the impulse response as shown in FIG. 9, the output from such a filter would be obtained.

Figure 10:
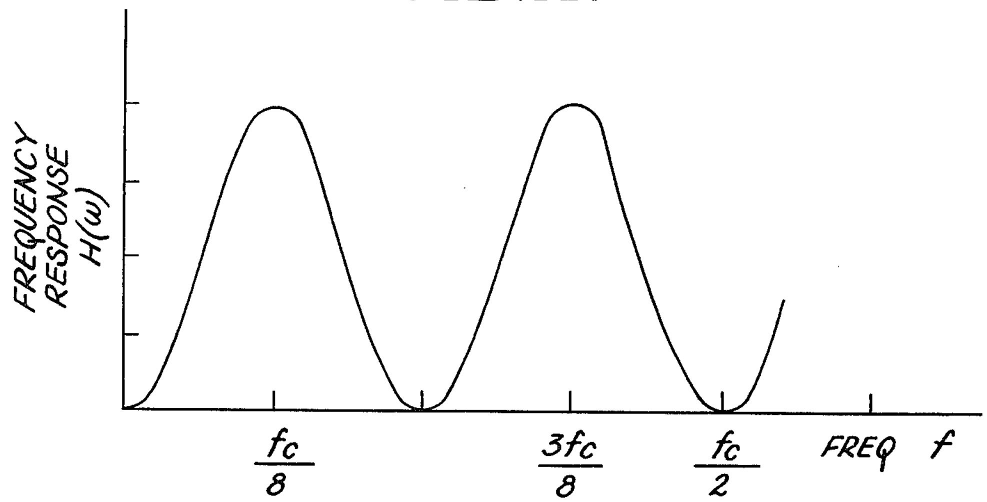
FIG. 10 is a diagram showing the frequency response of the apparatus of FIG. 3.

FIG. 10 shows the transform of the impulse response of FIG. 9 into the frequency domain.

The fractions of charge division, $\lambda$ and $\alpha$, produced by the first and second gating stages, respectively, will now be derived in terms of the physical structure shown in FIG. 3. The proportioning of the physical structure to meet the requirements of equation 6 will then be derived.

The fraction of the charge $Q^+_n$ applied to the first charge storage cell 20a of the first input stage after diverting a fraction thereof into the first charge storage cell 36 by actuation of the first gating stage 21 is a function of the capacitances of storage cells 20a and 36a, which will conveniently be designated capacitances $C_1$ and $C_3$ respectively.

Thus $$\lambda=C_1/(C_1+C_3) \quad (7)$$

and $$(1-\lambda)=C_3/(C_1+C_3) \quad (8)$$

The capacitance $C_1$ of cell 20a is equal to parallel combination of the dielectric capacitances of the composite storage cell 20b with respect to the overlying clocking electrode, the dielectric capacitance of storage cell 20c with respect to the overlying clocking electrode, the depletion capacitances of cells 20b and 20c, and the depletion capacitance of the regions of opposite conductivity type 33, 33a, 33b with respect to the substrate. The depletion capacitances are relatively small in relation to the dielectric capacitances of the storage cells 20b and 20c and will be initially ignored. Similarly capacitance $C_3$ of the composite cell 36a of the first gating stage is equal to the parallel combination of the dielectric capacitance of the storage cell 36 contiguous to region 34 of opposite conductivity type, the depletion capacitance of storage cell 36, and the depletion capacitance of the region 34 of opposite conductivity type with respect to the substrate. The depletion capacitances are relatively small in relation to the dielectric capacitances of the storage cell 14 and will be initially ignored.

The fraction of the charge $\lambda Q_n$ applied to the first charge storage cell 16a of the first stage of the first chift register 15, after equilibration with the charge in the first charge storage cell 14a and division thereof described above is a function of the capacitances of the storage cells 16a and 14a, which will be designated as capacitances $C_1$ and $C_2$, respectively. Capacitance $C_1$ of first storage cell 20a and the capacitance $C_1$ first storage cell 16a are conveniently made identical for reasons which will be apparent below.

Thus, $$\alpha=C_1/(C_1+C_2) \quad (9)$$

and $$(1-\alpha)=C_2/(C_1+C_2) \quad (10)$$

The capacitance $C_1$ of cell 16a is equal to parallel combination of the dielectric capacitances of the composite storage cell 16b with respect to the overlying clocking electrode, the dielectric capacitance of storage cell 20c with respect to the overlying clocking electrode, the depletion capacitances of cells 16b and 16c, and the depletion capacitance of the regions of opposite conductivity type 37, 37a, and 37b with respect to the substrate. The depletion capacitances are relatively small in relation to the dielectric capacitances of the storage cells 16*b* and 16*c* and will be initially ignored. Similarly capacitance $C_2$ of the composite cell 14 of the circulating shift register 11 is equal to the parallel combination of the dielectric capacitances of the two storage cells 14 contiguous to region 24 of opposite conductivity type, the depletion capacitances of these two storage cells 14, and the depletion capacitance of the region 38 of opposite conductivity type with respect to the substrate. The depletion capacitances are relatively small in relation to the dielectric capacitances of the storage cell 14 and will also be initially ignored. While depletion capacitance varies with the quantity of charge stored, it can be made largely independent of stored charge as well, if desired. See, for example, patent application Ser. No. 952,413 filed Oct. 18, 1978, now U.S. Pat. No. 4,240,089 assigned to the assignee of the present invention and incorporated hereby by reference thereto. Accordingly, depletion capacitances do not have to be ignored and may be included in the calculation of the fixed fraction, if precise values are desired.

Assume a packet of charge of unity magnitude is applied to the first input stage 21. As explained above, fraction of this charge appears as the first element $V_1$ of output and is given by the following equation:

$$V_1=\alpha\lambda \quad (11)$$

Using equations 7 and 9, $$V_1 = \left(\frac{C_1}{C_1 + C_2}\right)\left(\frac{C_1}{C_1 + C_3}\right) \quad (12)$$

As also explained above the fraction of the charge of unity magnitude which appears as the second element $V_2$ of the output sequence is given by the following equation:

$$V_2=\alpha[(1-\lambda)+(1-\alpha)\lambda] \quad (13)$$

Using equations 7–10

$$V_2 = \frac{C_1}{C_1 + C_2}\left[\frac{C_3}{C_1 + C_3} + \left(\frac{C_2}{C_1 + C_2}\right)\left(\frac{C_1}{C_1 + C_3}\right)\right] \quad (14)$$

To provide the output sequence shown in FIG. 2 in which the average value is zero, the requirement of the equation 6 must be fulfilled. Using this requirement, the value of $C_3$ as a function of $C_1$ and $C_2$ will now be derived. Substituting equations 12 and 14 in equation 6 yields $$C_3+(C_1C_2)/C_1+C_2=(1+A)C \quad (15)$$

Noting that the constant A is equal to $(1-\alpha)$ and hence is equal to $C_2/C_1+C_2$ reduces equation 15 to $$C_3=C_1 \quad (16)$$

Thus, providing storage cell 36*a* with the capacitance set forth in equation 16 will produce the impulse response shown in FIG. 2 and FIG. 9 in which the average value is zero. The frequency response of apparatus so constituted is shown in FIG. 10 which is the impulse response of FIG. 10 transformed into the frequency domain.

Inherent in the operation described above is the recombination of the portion $(1-\lambda)$ Qn the packet of the Qn applied to the input stage 19 with the portion $(1-\alpha)\lambda$ Qn circulated in the circular shift register 11 before the latter portion reaches the $N^{th}/2$ stage. Thus, $$L=K+M$$

where M is less than N/2. L is the number of stages in the second shift register 17. K is the number of stages between the input stages and the first stage of the circular shift register. M is the stage of the circular shift shift register in which recombination of the two portions $(1-\lambda)$Qn and $(1-x)\lambda$Qn occur. For the specific embodiment shown K=1, M=1, and L=2.

While the filter of FIGS. 3–7 has utilized charge transfer devices in which charge storage and transfer occurs in cells adjacent the surface of the semiconductor substrate, the present invention may be implemented with cells of opposite conductivity type regions. Structures of this type, commonly referred to as buried channel charge transfer devices are described in U.S. Pat. No. 3,902,187, assigned to the assignee of the present invention and incorporated herein by reference thereto. In such buried channel charge transfer devices charge storage and transfer occurs in cells below the surface of the semiconductor substrate. Implementation of prior art charge transfer filter with buried channel devices has particular advantages with respect to high speed operation, but suffers from nonlinearities resulting from the variable capacitance between the charge storage cells and their associated overlying electrodes. In the present invention such nonlinearities are not introduced into the output. In connection with a buried channel implementation, of course, surface charges input circuits such as those described above could be used.

The filter apparatus of the present invention may also be implemented in bucket brigade technology; however, such implementation would be less advantageous than in the charge coupled technology shown and described in FIGS. 1–4, as bucket brigade devices are subject to charge transfer inaccuracies which limit their performance.

While the invention has been described in specific embodiments in which single phase clocking systems have been employed, it will be understood that other clocking systems such as multi-phase clocking systems may as well be employed.

While the invention has been described in connection with apparatus constituted of N-type conductivity substrates, P-type conductivity substrates could as well be used. Of course, in such a case the applied potentials would be reversed in polarity.

While the invention has been described in specific embodiments, it will be understood that modifications, such as those described above, may be made by those skilled in the art, and it is intended by the appended claims to cover all such modifications and changes as fall within the true spirit and scope of the invention.

I claim:

1. In combination,

A circular shift register having N stages where N is an even number greater than two, each stage including a respective first charge storage cell, first means for transferring charge in said circular shift register from first charge storage cell to first charge storage cell thereof in the direction of order designation of the stages thereof and at one frequency, means providing a first input sequence of packets of charge, each packet representing a respective sample of a first input signal, a first shift register including a plurality stages, each stage including a respective first charge storage cell, a second shift register including L stages where L is an integer, each stage including a respective first charge storage cell, means for dividing each of said packets of charge of said first input sequence into a first part and a second part, the ratio of said first part to said second part being equal to a first fixed value, means for applying each of said first parts of said packets of said first input sequence to the input stage of said first shift register and for applying each of said second parts of said packets of said first input sequence to the input stage of said second shift register, second means for sequentially transferring at said one frequency each of said first parts of said first sequence of packets of charge from first charge storage cell to first charge storage cell of the stages of said first shift register, third means for sequentially transferring at said one frequency each of said second parts of said first sequence of packets of charge from first charge storage cell to first charge storage cell of the stages of said second shift register, said first, second and third transferring means being synchronized to provide storage of charge packets in the first charge storage cells of said first and second shift registers and in the first charge storage cells of said circular shift register over a common interval of time, recurrent at said one frequency, first means for combining the charge packet in the first charge storage cell in the $K^{th}$ stage of said first shift register with the charge packet in the first charge storage cell of the $N^{th}$ stage of said circular shift register during each of said common intervals of time and for dividing the combined packet of charge into two portions, a first portion being stored in the first charge storage cell of said $K^{th}$ stage and a second portion being stored in the first charge storage cell of the $N^{th}$ stage of said circular shift register, the ratio of said first portion of charge to the combined charge packet being equal to a second fixed value, means for transferring each first portion of a respective combined packet of charge out of said first charge storage cell of said $K^{th}$ stage at said one frequency to obtain a first output sequence of packets, second means for combining the charge packet in the first charge storage cell of the $L^{th}$ stage of said second shift register with the charge packet in the first charge storage cell of the $M^{th}$ stage of said circular shift register, where M is an integer less than N/2 and $L=K+M$.

2. The combination of claim 1 including, means providing a second input sequence of packets of charge, each packet representing a respective sample of a second input signal, a third shift register including a plurality of stages, each stage including a respective first charge storage cell, a fourth shift register including L stages, each stage including a respective first charge storage cell, means for dividing each of said packets of charge of said second input sequence into a first part and a second part, the ratio of said first part to said second part being equal to said first fixed value, means for applying each of said first parts of said packets of said second input sequence to the input stage of said third shift register and for applying each of said second parts of said packets of said second input sequence to the input stage of said fourth shift register, fourth means for sequentially transferring at said one frequency each of said first parts of said second sequence of packets of charge from first charge storage cell to first charge storage cell of the stages of said third shift register, fifth means for sequentially transferring at said one frequency each of said second parts of said sequence of packets of charge from first charge storage cell to first charge storage cell of the stages of said fourth shift register, said first, second, third, fourth and fifth transferring means being synchronized to provide storage of charge packets in the first charge storage cells of said first, second, third and fourth shift registers and in the first charge storage cells of said circular shift register over a common interval of time, recurrent at said one frequency, third means for combining the charge packet in the first charge storage cell in the $K^{th}$ stage of said third shift register with the charge packet in the first charge storage cell of the $(N/2)^{th}$ stage of said circular shift register during each of said common intervals of time and for dividing the combined packet of charge into two portions, a first portion being stored in the first charge storage cell of said $K^{th}$ stage of said third shift register and a second portion being stored in the first charge storage cell of the $(N/2)^{th}$ stage of said circular shift register, the ratio of said first portion of charge to the combined charge packet being equal to said fixed value, means for transferring each first portion of a respective combined packet of charge out of said first charge storage cell of said $K^{th}$ stage of said third shift register at said one frequency to obtain a second output sequence of packets, fourth means for combining the charge packet in the first charge storage cell of the $L^{th}$ stage of said fourth shift register with the charge packet in the $(N/2+M)^{th}$ stage of said circular shift register, means for deriving an output signal consisting of a series of samples, each of which represents the difference of corresponding charge packets of said first output sequence of packets and said second output sequence of packets.

3. The apparatus of claim 1 in which said plurality of first charge storage cells are formed in a substrate of semiconductor material.

4. The apparatus of claim 3 in which said plurality of first charge storage cells are formed adjacent a major surface of said substrate of semiconductor material.

* * * * *